United States Patent
Holzer

(10) Patent No.: US 9,118,368 B1
(45) Date of Patent: Aug. 25, 2015

(54) FEEDING AN OUTGOING SIGNAL BACK TO A PRE-DISTORTION MODULE

(71) Applicant: L-3 Communications Corp., New York, NY (US)

(72) Inventor: Kyle D. Holzer, Bountiful, UT (US)

(73) Assignee: L-3 Communications Corp., New York, NY (US)

( * ) Notice: Subject to any disclaimer, the term of this patent is extended or adjusted under 35 U.S.C. 154(b) by 141 days.

(21) Appl. No.: 13/919,385

(22) Filed: Jun. 17, 2013

(51) Int. Cl.
*H04B 1/04* (2006.01)

(52) U.S. Cl.
CPC ................................ *H04B 1/0475* (2013.01)

(58) Field of Classification Search
CPC combination set(s) only.
See application file for complete search history.

(56) References Cited

U.S. PATENT DOCUMENTS

| | | | |
|---|---|---|---|
| 8,416,883 B2 | 4/2013 | Behzad | |
| 2001/0050592 A1* | 12/2001 | Wright et al. | 330/2 |
| 2009/0054000 A1* | 2/2009 | Waheed et al. | 455/63.1 |
| 2010/0022201 A1 | 1/2010 | Vandenameele | |
| 2011/0292977 A1 | 12/2011 | Farjadrad | |
| 2013/0023210 A1* | 1/2013 | Rofougaran | 455/41.1 |
| 2013/0077540 A1* | 3/2013 | Black et al. | 370/277 |

* cited by examiner

*Primary Examiner* — Junpeng Chen
(74) *Attorney, Agent, or Firm* — Kirton | McConkie

(57) ABSTRACT

A signal coupler can couple a processed version of an outgoing signal from a transmission path to a receive path in a transceiver. A connector can provide the processed version of the outgoing signal to a pre-distortion module, which can generate a pre-distortion signal to pre-compensate outgoing signals in the transmission path of the transceiver. A receive path of a transceiver can thus be utilized as a feedback path to a pre-distortion module.

24 Claims, 5 Drawing Sheets

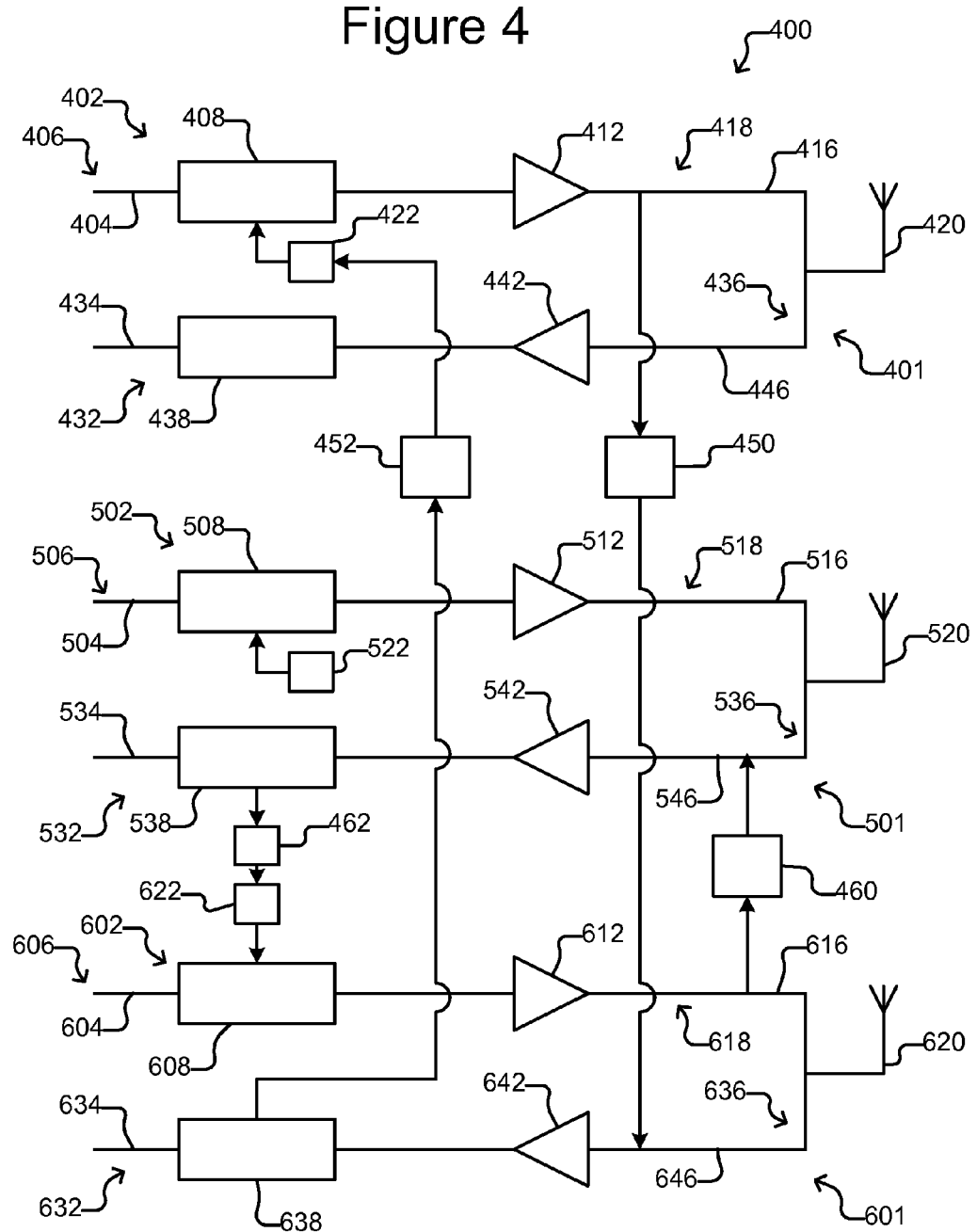

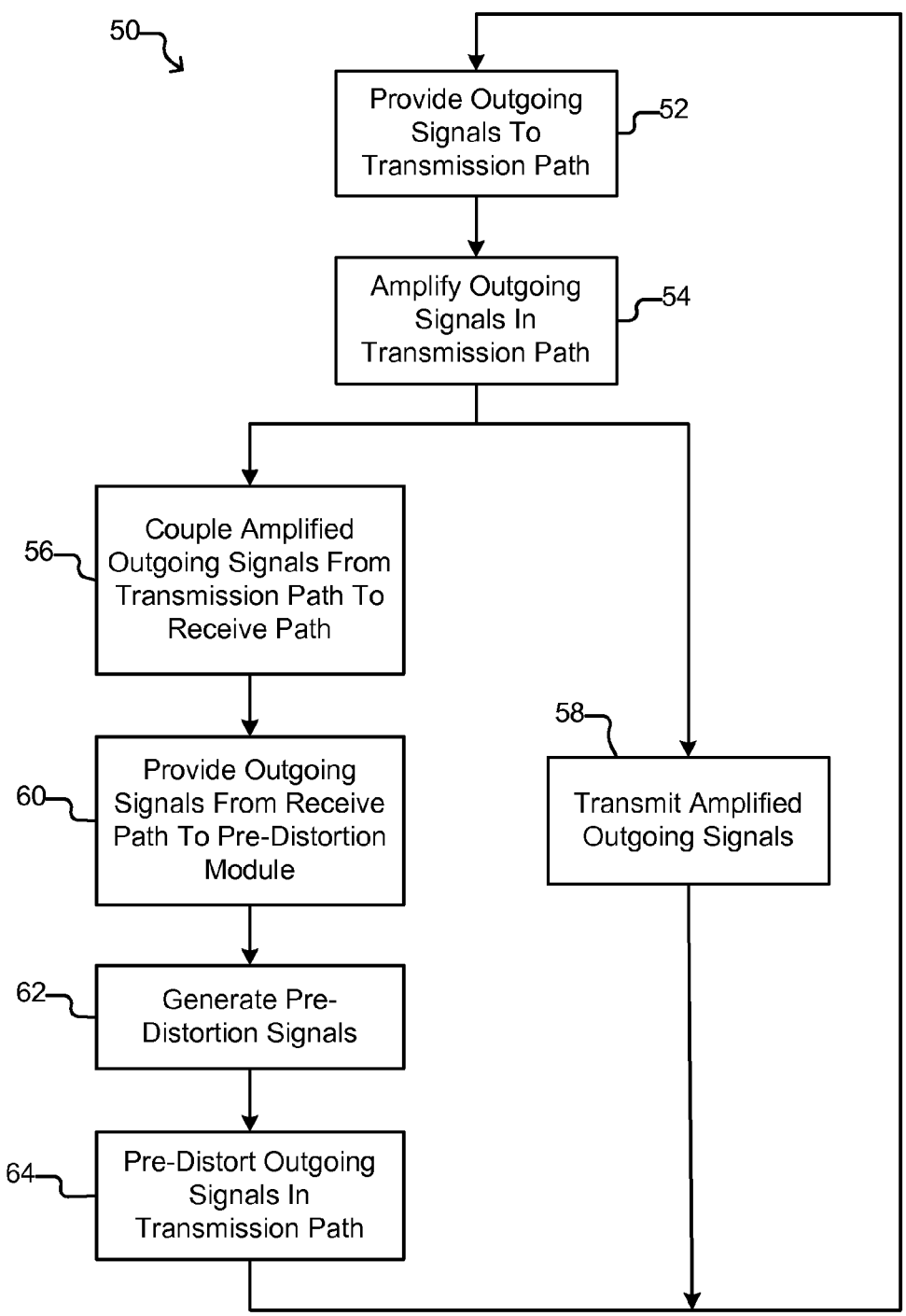

FEEDING AN OUTGOING SIGNAL BACK TO A PRE-DISTORTION MODULE

BACKGROUND

FIG. 1 illustrates a typical prior art transceiver 100. As shown, the transceiver 100 can include a transmission path 102 to a transmitter/receiver device 112 (e.g., an antenna) for outgoing signals. The transmission path 102 can comprise transmitter components 104 and a power amplifier 106, which can be connected to the transmitter/receiver device 112. The transceiver 100 can also include a receive path 122 for incoming signals, and the receive path 122 can comprise receiver components 124 and an amplifier 126, which can also be connected to the transmitter/receiver device 112.

Outgoing signals can be provided to the transmitter components 104, amplified by the power amplifier 106, and transmitted via the transmitter/receiver device 112. Incoming signals can be received by the transmitter/receiver device 112, amplified by the amplifier 126, and provided to the receiver components 124.

The transmitter components 104, the power amplifier 106, and other components (not shown) can introduce distortion into the outgoing signals as those signals pass through the transmission path 102. The outgoing signals provided to the transmitter/receiver device 112 are thus typically distorted. As shown, some prior art transceivers 100 include a pre-distortion module 114 configured to pre-distort the outgoing signals to compensate for the distortion introduced in the transmission path 102.

Some prior art transceivers 100 provide a dedicated feedback path 116 from the transmission path 102 to the pre-distortion module 114 for providing processed versions of the outgoing signals to the pre-distortion module 114. For example, as illustrated in FIG. 1, such a feedback path 116 can be provided from the output of the power amplifier 106 to the pre-distortion module 114. The pre-distortion module 114 can then utilize unprocessed versions of the outgoing signals and the fed back processed versions of the outgoing signals to generate pre-distortion signals, which can be utilized to pre-distort the outgoing signals to compensate those signals for the distortion introduced in the transmission path 102.

Such a dedicated feedback path 116 can, however, be difficult to implement. For example, there may not be sufficient space in a transceiver 100 for a dedicated feedback path 116. As another, example, the space required for the presence and routing of a dedicated feedback path 116 can cause the transceiver 100 to be larger than desired.

Although not shown in FIG. 1, some prior art transceivers 100 avoid use of a feedback path 116 by including in the pre-distortion module 114 a model of the transmission path 102. The pre-distortion module 114 utilizes the model to estimate distortion that the transmission path 102 introduces, and the pre-distortion module 114 generates compensating pre-distortion signals accordingly.

A model of the transmission path 102, however, can increase the complexity of the pre-distortion module 114 and typically does not account for changes in the operating environment such as temperature, humidity, and the like that can affect the actual distortion caused by components of the transmission path 102. Pre-distortion modules 116 that utilize transmission path models can thus avoid the need for a dedicated feedback path 116 but sacrifice accuracy.

Embodiments of the present invention address the foregoing and/or other problems.

SUMMARY

In some embodiments, a transceiver can comprise a transmission path, a pre-distortion module, a receive path, a signal coupler, and a connector. The transmission path can be from a transmit input to a transmitter device, and the transmission path can include a first amplifier. The pre-distortion module can comprise a desired signal input connected to the transmission path, a feedback input, and a pre-distortion output. The pre-distortion module can be configured to generate at the pre-distortion output a pre-distortion signal corresponding to an inverse of a difference between signals at the desired signal input and the feedback input. The receive path can be from a receiver device to a receive output, and the receive path can comprise a second amplifier. The signal coupler can couple an end portion of the transmission path between the first amplifier and the transmit device to an end portion of the receive path between the receiver device and the second amplifier. The connector can connect the receive path between the second amplifier and the receive output to the feedback input of the pre-distortion module.

In some embodiments, a process for providing a feedback signal for generation of a pre-distortion signal can include providing outgoing signals through a transmission path to a transmitter device of a transceiver. The transmission path can introduce distortion into the outgoing signals. The process can further include coupling processed versions of the outgoing signals from an end portion of the transmission path between a first amplifier in the transmission path and the transmitter device to a receive path connected to a receiver device of the transceiver. The process can also include providing from the receive path to a pre-distortion module the processed versions of the outgoing signals.

BRIEF DESCRIPTION OF THE DRAWINGS

FIG. 4 illustrates an example of a multi-transceiver device with couplers for coupling processed outgoing signals from a transmission path in one transceiver to a receive path in another transceiver according to some embodiments of the invention.

FIG. 5 shows an example of a process for providing a feedback signal in a receiver for generation of a pre-distortion signal according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, "substantially" means sufficient to work for the intended purpose. The term "ones" means more than one.

In some embodiments of the invention, a signal coupler can couple an outgoing signal from a signal transmission path to a signal receive path of a communications transceiver. A connector in the transceiver can then provide the outgoing signal to a pre-distortion module, which can generate a pre-distortion signal to pre-compensate outgoing signals in the transmission path to compensate for distortion imparted to the outgoing signals by the transmission path. Such embodiments of the invention can thus utilize a receive path of a transceiver as a feedback path to a pre-distortion module. Among other advantages, this can reduce the size and/or complexity of the transceiver as compared to prior art transceivers that utilize a dedicated feedback path to a pre-distortion module.

Figure 1:
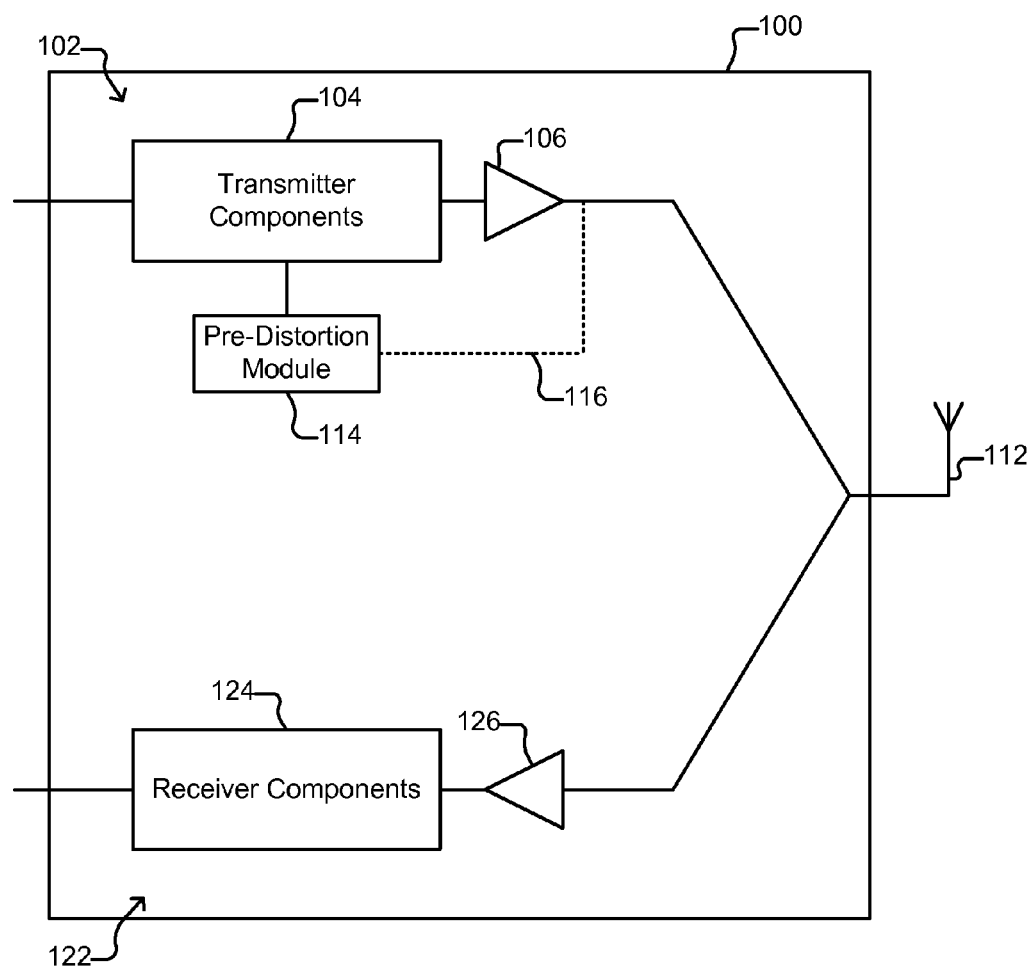
FIG. 1 is a depiction of a typical prior art transceiver.
Figure 2:
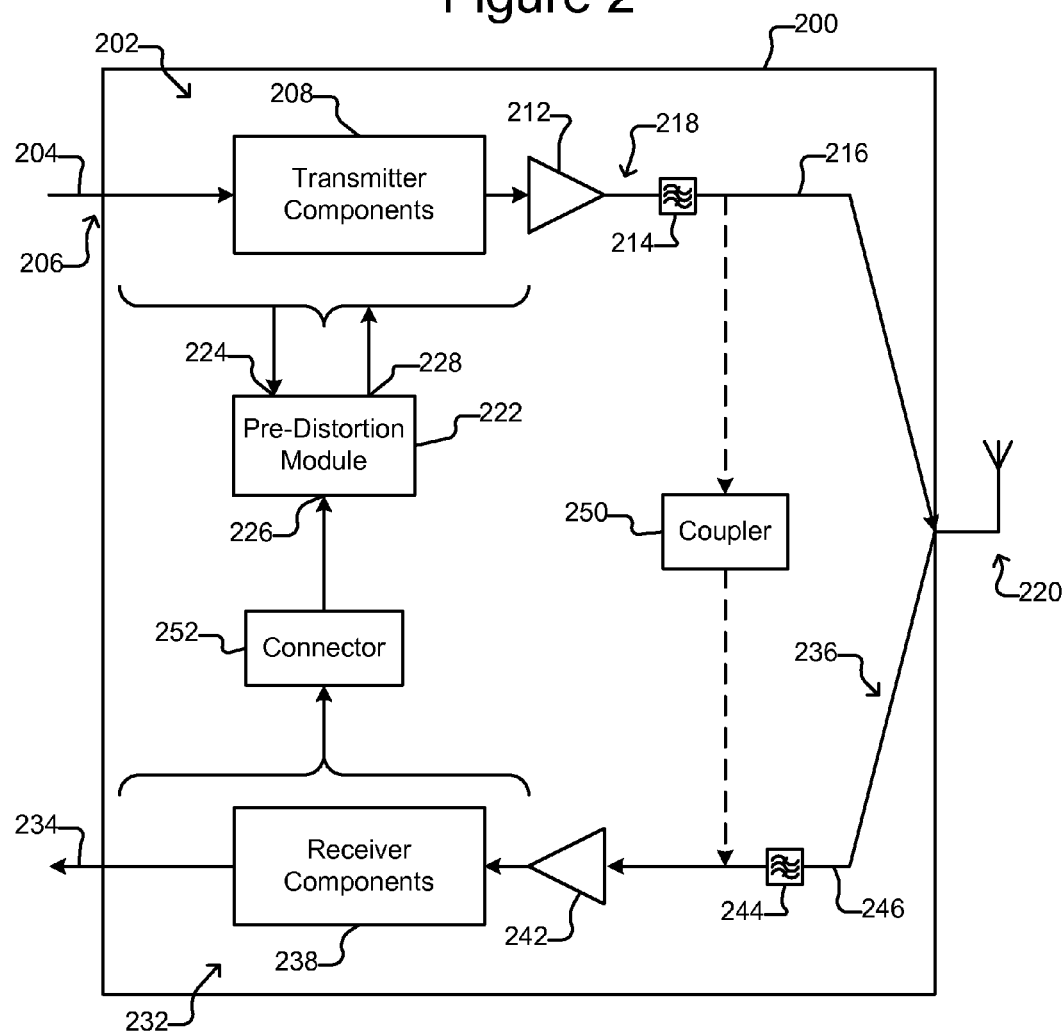
FIG. 2 illustrates an example of a transceiver with a coupler for coupling processed outgoing signals from a transmission path to a receive path according to some embodiments of the invention.

FIG. 2 illustrates an example of a transceiver 200 according to some embodiments of the invention. As shown, the transceiver 200 can comprise a transmission path 202, a receive path 232, a transmitter/receiver device 220, a pre-distortion module 222, a coupler 250, and a connector 252.

The transmission path 202 can be a communications path for outgoing signals 206 between an input 204 and the transmitter/receiver device 220. The outgoing signals 206 can be provided to the input 204 by, for example, signal processing modules (not shown). For example, the outgoing signals 206 can comprise modulated waveforms comprising information signals modulated into a carrier signal such as is known in communications fields. As shown, the transmission path 202 can comprise various transmitter components 208 and a power amplifier 212.

The transmitter components 208 can comprise various electronic circuit components such as electronic filters, amplifiers, or the like. The transmitter components 208 can be in the form of dedicated electronic circuitry, software controlled microprocessors, and/or the like. The transmitter components 208 can provide the outgoing signals 206 to the power amplifier 212, which can amplify the outgoing signals. Having passed through the transmitter components 208 and the power amplifier 212, the outgoing signals 206 provided at the input 206 of the transmission path 204 are referred to herein as processed versions of the input signals or simply processed outgoing signals 218.

The transmitter components 208, the power amplifier 212, and/or other components (not shown) of the transmission path 202 can distort the outgoing signals 206. The processed outgoing signals 218 can thus be distorted versions of the outgoing signals 206 at the input 204 of the transmission path 202.

The receive path 232 can be a path to an output 234 for incoming signals 236 received by the transmitter/receiver device 220. The incoming signals 236 can be, for example, modulated waveforms transmitted by a remotely located transmitter device (not shown) or another transceiver (not shown). The output 234 of the receive path 232 can be connected to signal processing modules (not shown), which can demodulate and/or otherwise process the incoming signals 236 to, for example, extract information content from the incoming signals 236. As shown, the receive path 232 can comprise an amplifier 242 and receiver components 238.

The amplifier 242 in the receive path 232 can amplify the incoming signals 236. For example, the incoming signals 236 can have a first power level in a first power range, and the amplifier 242 can amplify the incoming signals 236 to a second power level in a second power range. The second power level can be greater than the first power level, and the second power range can be greater than the first power range. Moreover, the first power range and the second power range can be non-overlapping.

As shown, amplified incoming signals 236 can be provided from the amplifier 242 to the receiver components 238, which can comprise various electronic circuit components such as electronic filters, amplifiers, or the like. Like the transmitter components 208, the receiver components 238 can be in the form of dedicated electronic circuitry, software controlled microprocessors, and/or the like.

The transmitter/receiver device 220 can be any device suitable for transmitting the processed outgoing signals 218 and receiving the incoming signals 236. The processed outgoing signals 218 and the incoming signals 236 can be radio frequency signals (RF), light signals, or the like. The transmitter/receiver device 220 can be suitable for the type of processed outgoing signals 218 and incoming signals 236. For example, if the signals 218, 236 are RF signals, the transmitter/receiver device 220 can comprise an antenna for radiating RF signals into and receiving RF signals from ambient air or space, an electronic modem (e.g., for driving RF signals into and receiving RF signals from an electrically conductive cable), or the like. As another example, if the signals 218, 236 are light signals, the transmitter/receiver device 220 can comprise an optical modem (e.g., for driving light signals into and receiving light signals from an optical cable) or the like.

The transmitter/receiver device 220 can be a single device to which both the transmission path 202 and the receive path 232 are connected as shown in FIG. 2. The transceiver 200 can be configured to separate the transmission path 202 from the receive path 232. For example, as shown in FIG. 2, the end portion 216 of the transmission path 202 from the power amplifier 212 to the transmitter/receiver device 220 can comprise a first band pass filter 214 configured to substantially pass signals only within a first frequency band, and the end portion 246 of the receive path 232 from the transmitter/receiver device 220 to the amplifier 242 can similarly comprise a second band pass filter 244 configured to substantially pass signals only within a second frequency band. The first frequency band and the second frequency band can be non-overlapping and sufficiently separated that the processed outgoing signals 218 are substantially prevented by the second band pass filter 244 from entering the receive path 232 and the incoming signals 236 are substantially prevented by the first band pass filter 214 from entering the transmission path 202. As another example, rather than or in addition to the filers 214, 244, a switch (not shown) can switch the transmitter/receiver device 220 between the transmission path 202 and the receive path 232.

Alternatively, the transmitter/receiver device 220 can comprise a transmitter device and a separate receiver device. For example, the transmitter/receiver device 220 can comprise a transmitter device (not shown) to which the transmission path 202 but not the receive path 232 is connected and a separate receiver device (not shown) to which the receive path 232 but not the transmission path 202 is connected.

The pre-distortion module 222 can comprise a desired signal input 224, a feedback input 226, and an output 228. The pre-distortion module 222 can be configured to output a pre-distortion signal at the output 228 and distort outgoing signals 206 in the transmission path 202 with the pre-distortion signal. The pre-distortion module 22s can generate the pre-distortion signal in accordance with a difference (e.g., an inverse difference) between a first signal at the desired signal input 224 and second signal at the feedback input 226. For example, the pre-distortion signal generated by the pre-distortion module 222 at the output 228 can correspond to (e.g., be) an inverse of the difference between the first signal at the desired signal input 224 and the second signal at the feedback input 226.

For example, the first signal provided to the desired signal input 224 of the pre-distortion module 222 can be the outgoing signals 206, and the second signal provided to the feedback input 226 of the pre-distortion module 222 can be the processed outgoing signals 218. The difference between the first signal at the desired signal input 224 and the second signal at the feedback input 226 can thus be the distortion introduced by the transmission path 202 into the outgoing signals 206. The pre-distortion signal generated by the pre-distortion module 222 at the output 228 can be the inverse of the distortion in the processed outgoing signals 218. Pre-distorting the outgoing signals 206 can thus compensate those signals 206 for the distortion introduced by the transmission path 202, and the processed outgoing signals 218 can thus be substantially the same as the outgoing signals 206 introduced at the input 204 of the transmission path 202.

Many pre-distortion techniques, algorithms, designs, and the like are known, and the pre-distortion module 222 can be configured in accordance with any such known technique, algorithm, design, or the like. For example, the pre-distortion module 222 can be configured for adaptive noise cancellation filter. Regardless, the pre-distortion module 222 can be configured as an electronic circuit comprising electronic circuit elements, a microprocessor configured to operate in accordance with software stored in a memory, or a combination of an electronic circuit and a microprocessor configured to operate in accordance with software.

As shown in FIG. 2, the desired signal input 224 of the pre-distortion module 222 can be connected to the transmission path 202 between the input 204 and the power amplifier 212. For example, the desired signal input 224 can be connected to the transmission path 202 between the input 204 and the transmitter components 208. The outgoing signals 206 can thus be provided from the transmission path 202 to the desired signal input 224 of the pre-distortion module 222. As will be seen, the processed outgoing signals 218 can be provided from the end portion 216 of the transmission path 202 through the coupler 250 to the receive path 232 and through the connector 252 to the feedback input 226 of the pre-distortion module 222. The pre-distortion signal generated by the pre-distortion module 222 at the output 228 can thus correspond to a difference (e.g., an inverse of the difference) between the outgoing signals 206 and the processed outgoing signals 218, which as discussed above, corresponds to distortion introduced into the processed outgoing signals 218 by the transmission path 202 or other distortion sources.

The pre-distortion module 222 can pre-distort with the pre-distortion signal at the output 228 outgoing signals 206 in the transmission path 202 between the input 204 and the power amplifier 212. For example, the pre-distortion module 22 can combine (e.g., add, subtract, multiply, or the like) the pre-distortion signal at the output 228 with outgoing signals 206 in the transmission path 202 between the input 204 and the power amplifier 212 (e.g., between the input 204 and the transmitter components 208).

The coupler 250 can couple the transmission path 202 to the receive path 232. For example, as shown in FIG. 2, the coupler 250 can couple a part of the end portion 216 of the transmission path 202 to a part of the end portion 246 of the receive path 232. As noted above, the end portion 216 of the transmission path 202 can be from the power amplifier 212 to the transmitter/receiver device 220, and the end portion 246 of the receive path 232 can be from the transmitter/receiver device 220 to the amplifier 242.

The coupler 250 can be any electronic, magnetic, electromagnetic, and/or optical device for coupling a signal in one signal path to another signal path. For example, the coupler 250 can be an electronic contact connection. As another example, the coupler 250 can be an RF coupler. As yet another example, the coupler 250 can be an electromagnetic coupler.

Regardless, the coupler 250 can couple the processed outgoing signal 218 from the end portion 216 of the transmission path 202 into the end portion 246 of the receive path 232. Moreover, as noted, the amplifier 242 can be configured to amplify the received signals 236 at a first power level in a first power range to a second power level in a second power range as discussed above. The coupler 250 can be configured to couple the processed outgoing signals 218 into the end portion 246 of the receive path 232 at a power level that is in the second power range. For example, in some embodiments, the coupler 250 can couple the end portion 216 of the transmission path 202 to the end portion 246 of the receive path 232 with a power loss of between negative sixty and negative one-hundred twenty decibels.

Figure 3:
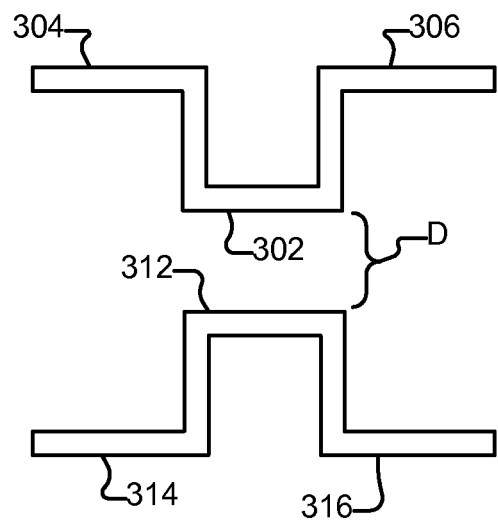
FIG. 3 shows an example of an electromagnetic coupler according to some embodiments of the invention.

FIG. 3 illustrates a non-limiting example of the coupler 250 comprising two coupling traces 302, 312 spaced a distance D apart. In the example shown in FIG. 3, all or part of the end portion 216 of the transmission path 202 (see FIG. 2) can comprise main traces 304, 306 and the coupling trace 302. For example, the main trace 304 can be connected to the output of the power amplifier 212 in FIG. 2, and the main trace 306 can be connected to the transmitter/receiver device 220. The coupling trace 302 can thus be part of the end portion 216 of the transmission path 202. All or part of the end portion 246 of the receive path 232 can similarly comprise main traces 314, 316 and the coupling trace 312. For example, the main trace 314 can be connected to the input of the amplifier 242, and the main trace 316 can be connected to the transmitter/receiver device 220. The coupling trace 312 can thus be part of the end portion 246 of the receive path 232.

Each of the main traces 304, 306, 314, 316 and coupling traces 302, 312 in FIG. 3 can be electrically conductive strips of an electrically conductive material (e.g., metal), an electrically conductive wire, or the like. The distance D between the coupling traces 302, 312 can be sufficiently small that a signal in one trace (e.g., 302) is electromagnetically generated in the other trace (e.g., 312). The processed outgoing signals 218 can thus be coupled from the coupling trace 302 to the coupling trace 312. Moreover, the distance D can be such that the processed outgoing signals 218 are coupled to the coupling trace 312 at a power level in the second power range as discussed above. For example, as discussed above, the distance D can be such that the processed outgoing signals 218 are coupled into the coupling trace 312 at a power loss of between negative sixty and negative one-hundred twenty decibels.

With reference again to FIG. 2, the connector 252 can connect the receive path 232 to the feedback input 226 of the pre-distortion module 222. As discussed above, the coupler 250 can couple the processed outgoing signals 218 from the transmission path 202 into the end portion 246 of the receive path 232. Once coupled into the end portion 246 of the transmission path 202, the processed outgoing signals 218 can be amplified by the amplifier 242 and provided to the receiver components 238. The connector 252 can thus provide the processed outgoing signals 218 from the receive path 232 to the feedback input 226 of the pre-distortion module 222.

As illustrated in FIG. 2, the connector 252 can connect the receive path 232 from between the amplifier 242 and the output 234 to the feedback input 226 of the pre-distortion module 222. For example, the connector 252 can connect the receive path 232 from between the receiver components 238 and the output 234 to the feedback input 226.

The connector 252 can be any device that can connect the receive path 232 to the pre-distortion module 222 and thereby provide a signal from the receive path 232 to the feedback input 226 of the pre-distortion module 222. For example, the connector 252 can be an electrically conductive connector that physically connects the receive path 232 to the feedback input 226. As another example, the connector 252 can be an RF coupler, an electromagnetic coupler, an optical coupler, or the like generally as discussed above with respect to the coupler 250.

As yet another example, the connector 252 can comprise a band pass filter (not shown) that corresponds generally to the band pass filter 214 in the end portion 216 of the transmission path 202. For example, the connector 252 can comprise a band pass filter (not shown) that substantially passes only frequencies in the first frequency band of the band pass filter 214 as discussed above. As also discussed above, the band pass filter 244 in the end portion 246 of the receive path 232 can substantially pass only frequencies in the second frequency band. With the coupler 250 connected to the transmission path 202 after the band pass filter 214 and to the receive path 232 after the band pass filter 244 as shown in FIG. 2, the processed outgoing signals 218 coupled by the coupler 250 into the receive path 232 will contain substantially only frequencies in the first frequency band of the band pass filter 214, and incoming signals 236 received at the transmitter/receiver device 220 will contain substantially only frequencies in the second frequency band of the band pass filter 244. A band pass filter (not shown) in the connector 252 similar to the first band pass filter 214 in the transmission path 202 can thus pass from the receive path 232 to the feedback input 226 of the pre-distortion module 222 substantially only the processed outgoing signals 218 but not the received signals 236.

In accordance with the above discussion of FIG. 2, the transceiver 200 can transmit via the transmitter/receiver device 220 outgoing signals 206/218 and receive also via the transmitter/receiver device 220 incoming signals 236. Moreover, while doing so, the coupler 250 of the transceiver 200 can also couple the processed outgoing signals 218 into the receive path 232, where the processed outgoing signals 218 can be amplified by the amplifier 242 and provided by the connector 252 to the feedback input 226 of the pre-distortion module 222. The pre-distortion module 222 can generate from the processed outgoing signals 218 a pre-distortion signal, which the pre-distortion module 222 can use to pre-distort outgoing signals 206 in the transmission path 202 to compensate for the distortion imparted to the outgoing signals 206 by the transmitter components 208, the power amplifier 212, and/or other components (not shown) of the transmission path 202. The result can be that the processed outgoing signals 218 are not distorted but are substantially similar to the outgoing signals 206 as received at the input 204 to the transmission path 202.

FIG. 4 illustrates an example of a multi-transceiver device 400 according to some embodiments of the invention. As shown, the device 400 can comprise a plurality of transceivers 401, 501, 601 (although three are shown, there can be more or fewer) each of which can be configured generally like the transceiver 200 of FIG. 2 including any embodiment or variation discussed above.

For example, a first transceiver 401 can comprise a transmission path 402 between an input 404 and a transmitter/receiver device 420 and a receive path 432 from the transmitter/receiver device 420 to an output 434. The transmission path 402 can comprise transmitter components 408 and a power amplifier 412, and the receive path 432 can comprise an amplifier 442 and receiver components 438. The first transceiver 401 can also include a pre-distortion module 422. Each of the foregoing can be the same as or similar to like named elements in FIG. 2.

That is, the transmission path 402, input 404, transmitter components 408, power amplifier 412, and transmitter/receiver device 420 can function and be the same as or similar to the transmission path 202, input 204, transmitter components 208, power amplifier 212, and transmitter/receiver device 220 discussed above with respect to FIG. 2. Likewise, the receive path 432, output 434, receiver components 438, and amplifier 442 can function and be the same as or similar to the receive path 232, output 234, receiver components 238, and amplifier 242 discussed above.

Outgoing signals 406 provided to the input 404 of the transmission path 402 can be transmitted as processed versions 418 of the outgoing signals 406 by the transmitter/receiver device 420 generally in accordance with the discussion of outgoing signals 206/218 in FIG. 2 above. Incoming signals 436 received at the transmitter/receiver device 420 can be provided through the receive path 432 to the output 434 generally in accordance with the discussion of incoming signals 236 in FIG. 2 above.

Likewise, a second transceiver 501 of the device 400 of FIG. 4 can comprise a transmission path 502 between an input 504 and a transmitter/receiver device 520 and a receive path 532 from the transmitter/receiver device 520 to an output 534. The transmission path 502 can comprise transmitter components 508 and a power amplifier 512, and the receive path 534 can comprise an amplifier 542 and receiver components 538. The second transceiver 501 can also include a pre-distortion module 522. Each of the foregoing can be the same as or similar to like named elements in FIG. 2.

That is, the transmission path 502, input 504, transmitter components 508, power amplifier 512, and transmitter/receiver device 520 can function and be the same as or similar to the transmission path 202, input 204, transmitter components 208, power amplifier 212, and transmitter/receiver device 220 discussed above. Likewise, the receive path 532, output 534, receiver components 538, and amplifier 542 can function and be the same as or similar to the receive path 232, output 234, receiver components 238, and amplifier 242 discussed above.

Outgoing signals 506 provided to the input 504 of the transmission path 502 can be transmitted as processed versions 518 of the outgoing signals 506 by the transmitter/receiver device 520 generally in accordance with the discussion of signals 206/218 in FIG. 2 above. Incoming signals 536 received at the transmitter/receiver device 520 can be provided through the receive path 532 to the output 534 generally in accordance with the discussion of incoming signals 236 in FIG. 2 above.

Similarly, a third transceiver 601 of the device 400 of FIG. 4 can comprise a transmission path 602 between an input 604 and a transmitter/receiver device 620 and a receive path 632 from the transmitter/receiver device 620 to an output 634. The transmission path 602 can comprise transmitter components 608 and a power amplifier 612, and the receive path 634 can comprise an amplifier 642 and receiver components 638. The first transceiver 601 can also include a pre-distortion module 622. Each of the foregoing can be the same as or similar to like named elements in FIG. 2.

That is, the transmission path 602, input 604, transmitter components 608, power amplifier 612, and transmitter/receiver device 620 can function and be the same as or similar to the transmission path 202, input 204, transmitter components 208, power amplifier 212, and transmitter/receiver device 220 discussed above. Likewise, the receive path 632, output 634, receiver components 638, and amplifier 642 can function and be the same as or similar to the receive path 232, output 234, receiver components 238, and amplifier 242 discussed above.

Outgoing signals 606 provided to the input 604 of the transmission path 602 can be transmitted as processed versions 618 of the outgoing signals 606 by the transmitter/receiver device 620 generally in accordance with the discussion of signals 206/218 in FIG. 2 above. Incoming signals 636 received at the transmitter/receiver device 620 can be provided through the receive path 632 to the output 634 generally in accordance with the discussion of incoming signals 236 in FIG. 2 above.

As shown in FIG. 4, the device 400 can also comprise a plurality of couplers 450, 460 each of which can function and be the same as or similar to the coupler 250 discussed above. The device 400 can also comprise connectors 452, 462 each of which can function and be the same as or similar to the connector 252 discussed above. (Although two couplers 450, 460 and two connectors 452, 462 are shown, there can be more or fewer.)

As shown, however, each coupler 450, 460 can couple a transmission path 402, 502, 602 in one transceiver 401, 501, 601 to a receive path 432, 532, 632 in another transceiver 401, 501, 601. For example, as shown, the coupler 450 can couple the end portion 416 of the transmission path 402 of the first transceiver 401 to the end portion 646 of the receive path 632 of the third transceiver 601. As another example, the coupler 460 can couple the end portion 616 of the transmission path 602 of the third transceiver 601 to the end portion 546 of the receive path 532 of the second transceiver 501.

Likewise, each connector 452, 462 can connect a receive path 432, 532, 632 in one transceiver 401, 501, 601 to a pre-distortion module 422, 522, 622 in another transceiver 401, 501, 601. For example, as shown, the connector 452 can connect the receive path 632 of the third transceiver 601 to the pre-distortion module 422 of the first transceiver 401. As another example, as shown, the connector 462 can connect the receive path 532 of the second transceiver 501 to the pre-distortion module 622 of the third transceiver 601.

FIG. 5 shows an example of a process 50 for providing a feedback signal in a transceiver for generation of a pre-distortion signal according to some embodiments of the invention. Although the process 50 is discussed below with respect to the transceiver 200 of FIG. 2 and the device 400 of FIG. 4, the process 50 is not limited to operation on the foregoing devices.

As shown, at step 52, the process 50 can provide outgoing signals to the transmission path of a transceiver. For example, generally as discussed above, outgoing signals 206 can be provided to the input 204 of the transmission path 202 of the transceiver 200 of FIG. 2. As another example, outgoing signals 406, 506, 606 can be provided to the inputs 404, 504, 604 of the transmission paths 402, 502, 602 of the device 400 of FIG. 4 as discussed above.

At step 54, the process 50 can amplify in the transmission path the outgoing signals provided at step 52. For example, the power amplifier 212 of the transceiver 200 can amplify in the transmission path 202 the outgoing signals 206. As another example, the power amplifiers 412, 512, 612 of the device 400 of FIG. 4 can amplify the outgoing signals 406, 506, 606 in the transmission paths 402, 502, 602.

At step 56, the process 50 can couple the outgoing signals amplified at step 54 to the receive path of the transceiver. For example, the coupler 250 can couple the processed outgoing signals 218 (which were amplified by the power amplifier 212) to the receive path 232 of the device 200 of FIG. 2 as discussed above. As another example, the coupler 450 can couple the processed outgoing signals 418 from the transmission path 402 of the first transceiver 401 to the receive path 632 of the third transceiver 601 of the device 400 of FIG. 4 as discussed above, and the coupler 460 can couple the processed outgoing signals 618 from the transmission path 602 of the third transceiver 601 to the receive path 532 of the second transceiver 501 as discussed above.

At step 58, the process 50 can also transmit the outgoing signals amplified at step 54. For example, the processed outgoing signals 218 can be transmitted by the transmitter/receiver device 220 of the transceiver 200 of FIG. 200 as discussed above. As another example, the processed outgoing signals 418, 518, 618 can be transmitted, respectively, by the transmitter/receiver devices 420, 520, 620 of the device 400 of FIG. 4. Regardless of how performed, step 58 can be performed generally in parallel with one or more of steps 56 and/or 60-64.

At step 60, the process 50 can provide the outgoing signals (coupled into the receive path at step 56) from the receive path to a pre-distortion module. For example, the connector 252 of the transceiver 200 of FIG. 2 can connect the processed outgoing signals 218 from the receive path 232 to the feedback input 226 of the pre-distortion module 222 as discussed above. As another example, the connectors 452, 462 can connect the receive paths 632, 532 to the pre-distortion modules 422, 622 as discussed above.

At step 62, the process 50 can generate pre-distortion signals utilizing the outgoing signals provided to the pre-distortion module at step 60. For example, the pre-distortion module 222 of the transceiver 200 of FIG. 2 can utilize the signals at the desired signal input 224 and the feedback input 226 to generate a pre-distortion signal at the output 228 as discussed above. As another example, pre-distortion modules 422, 622 can generate pre-distortion signals as discussed above.

At step 64, the process 50 can pre-distort outgoing signals in the transmission path of the transceiver utilizing the pre-distortion signals generated at step 62. For example, the pre-distortion module 222 of the transceiver 200 of FIG. 2 can utilize the pre-distortion generated at the output 228 to pre-distort outgoing signals 206 in the transmission path 202 as discussed above. As another example, the pre-distortion modules 422, 622 can utilize the pre-distortion signals generated at step 62 to pre-distort the outgoing signals 406, 606 in the transmission path 402 of the first transceiver 401 and the transmission path 602 of the third transceiver 601 as discussed above.

As illustrated in FIG. 5, the process 50 can repeat steps 52-64 one or more times.

Although specific embodiments and applications of the invention have been described in this specification, these embodiments and applications are exemplary only, and many variations are possible.

I claim:

1. A transceiver comprising:
a transmission path to and terminating at a transmitter antenna, wherein said transmission path comprises a transmission path amplifier;
a pre-distortion module comprising a desired signal input connected to said transmission path, a feedback input, and a pre-distortion output, wherein said pre-distortion module is configured to generate at said pre-distortion output a pre-distortion signal corresponding to an inverse of a difference between signals at said desired signal input and said feedback input;
a receive path originating from a receiver antenna, wherein said receive path comprises a receive path amplifier;
a signal coupler electromagnetically coupling a length of said transmission path between said transmission path amplifier and said transmitter antenna to a length of said receive path between said receiver antenna and said receive path amplifier; and
a connector connecting an output of said receive path amplifier to said feedback input of said pre-distortion module.

2. The transceiver of claim 1, wherein said transmitter antenna and said receiver antenna are a same antenna.

3. The transceiver of claim 1, wherein:
said receive path further comprises a receive path band pass filter disposed between said receiver antenna and said receive path amplifier, and
said length of said receive path is between said receive path band pass filter and said receive path amplifier.

4. The transceiver of claim 3, wherein:
said transmission path further comprises a transmission path band pass filter disposed between said transmission path amplifier and said transmitter antenna, and
said length of said transmission path is between said transmission path band pass filter and said transmitter antenna.

5. The transceiver of claim 4, wherein a pass band of said transmission path band pass filter does not overlap a pass band of said receive path band pass filter.

6. The transceiver of claim 1, wherein:
said length of said transmission path comprises a first electrical trace,
said length of said receive path comprises a second electrical trace disposed in sufficient proximity to said first electrical trace to electromagnetically couple therewith, and
said electromagnetically coupling is between said first electrical trace and said second electrical trace.

7. A transceiver comprising:
a transmission path from a transmit input to a transmitter device, wherein said transmission path comprises a first amplifier;
a pre-distortion module comprising a desired signal input connected to said transmission path, a feedback input, and a pre-distortion output, wherein said pre-distortion module is configured to generate at said pre-distortion output a pre-distortion signal corresponding to an inverse of a difference between signals at said desired signal input and said feedback input;
a receive path from a receiver device to a receive output, wherein said receive path comprises a second amplifier;
a signal coupler coupling an end portion of said transmission path between said first amplifier and said transmitter device to an end portion of said receive path between said receiver device and said second amplifier; and
a connector connecting said receive path between said second amplifier and said receive output to said feedback input of said pre-distortion module,
wherein:
said end portion of said transmission path comprises a first band pass filter configured to pass substantially only frequencies in a first pass band,
said end portion of said receive path comprises a second band pass filter configured to pass substantially only frequencies in a second pass band,
said first pass band does not overlap said second pass band, and
said coupler couples said end portion of said transmission path between said first band pass filter and said transmitter device to said end portion of said receive path between said second band pass filter and said second amplifier.

8. The transceiver of claim 7, wherein said connector comprises a third band pass filter configured to pass substantially only frequencies in said first pass band.

9. The transceiver of claim 7, wherein said coupler is a radio frequency (RF) coupler.

10. The transceiver of claim 7, wherein said coupler comprises:
a first electrically conductive trace that is part of said end portion of said transmission path; and
a second electrically conductive trace that is part of said end portion of said receive path,
wherein said first trace is physically separated from said second trace by a distance D.

11. The transceiver of claim 7, wherein:
said second amplifier is configured to amplify signals in said receive path from a power level in a first power range to a power level in a second power range, and
said coupler is configured to couple a signal in said end portion of said transmission path into said end portion of said receive path with a power level in said first power range.

12. The transceiver of claim 7, wherein said coupler couples said end portion of said transmission path to said end portion of said receive path with a decrease in power between negative sixty decibels and negative one-hundred and twenty decibels.

13. The transceiver of claim 7, wherein said coupler electromagnetically couples said end portion of said transmission path to said end portion of said receive path.

14. The transceiver of claim 7 further comprising a combined transmitter/receiver device connected to said transmission path and said receive path, wherein said transmitter/receiver device is said transmitter device and said receiver device.

15. The transceiver of claim 7, wherein said transmitter/receiver device comprises an antenna.

16. The transceiver of claim 7, wherein:
said transmitter device to which said transmission path is connected is part of a first combined transmitter/receiver device,
said receiver device to which said receive path is connected is part of a second transmitter/receiver device, and
said first transmitter/receiver device is different than said second transmitter/receiver device.

17. A process for providing a feedback signal for generation of a pre-distortion signal in a transceiver comprising a transmission path terminating at a transmitter antenna for radiating outgoing signals and a receive path originating at a receiver antenna for receiving incoming signals, said process comprising:

providing outgoing signals through said transmission path to said transmitter antenna, said transmission path introducing distortion into said outgoing signals;

as said outgoing signals pass through said transmission path to said transmitter antenna, said outgoing signals electromagnetically coupling from a length of said transmission path between a transmission path amplifier in said transmission path and said transmitter antenna into a length of said receive path between said receiver antenna and a receive path amplifier in said receive path;

said transmitter antenna radiating said outgoing signals; and providing said outgoing signals coupled into said length of said receive path from said receive path as feedback signals to a pre-distortion module.

18. The process of claim 17 further comprising generating pre-distortion signals with said pre-distortion module utilizing said outgoing signals provided to said transmission path and said feedback signals, wherein said pre-distortion signals compensate for said distortion.

19. The process of claim 18 further comprising modifying outgoing signals in said transmission path utilizing said pre-distortion signals.

20. The process of claim 17, wherein said transmitter antenna and said receiver antenna are a same antenna.

21. The process of claim 17 further comprising filtering with a band pass filter disposed in said receive path between said receiver antenna and said receive path amplifier incoming signals received at said receiver antenna from a distant transmitter, wherein said length of said receive path is between said band pass filter and said receive path amplifier.

22. The process of claim 21 further comprising filtering said outgoing signals with a band pass filter disposed in said transmission path between said transmission path amplifier and said transmitter antenna, wherein said length of said transmission path is between said band pass filter in said transmission path and said transmitter antenna.

23. The process of claim 22, wherein a pass band of said band pass filter in said transmission path and a pass band of said band pass filter in said receive path do not overlap.

24. The process of claim 17, wherein:

said length of said transmission path comprises a first electrical trace, said length of said receive path comprises a second electrical trace disposed in sufficient proximity to said first electrical trace to electromagnetically couple therewith, and said electromagnetically coupling is between said first electrical trace and said second electrical trace.

\* \* \* \* \*